United States Patent [19]

Qureshi et al.

[11] Patent Number: 5,774,003

[45] Date of Patent: Jun. 30, 1998

[54] FLIP-FLOP CELL HAVING CLOCK SKEW PROTECTION

[75] Inventors: Fazal Ur Rahman Qureshi, Cupertino; Martin William Person, Mountain View, both of Calif.

[73] Assignee: National Semiconductor Corporation, Santa Clara, Calif.

[21] Appl. No.: 727,289

[22] Filed: Oct. 9, 1996

[51] Int. Cl.⁶ .................................................. G01R 31/28
[52] U.S. Cl. ............................ 327/202; 327/212; 327/213
[58] Field of Search ..................................... 327/199–203, 327/208–214, 225; 371/22.1, 22.3

[56] References Cited

U.S. PATENT DOCUMENTS

| | | | |
|---|---|---|---|
| 4,873,456 | 10/1989 | Olisar et al. | 327/199 |
| 5,115,435 | 5/1992 | Langford, II et al. | 371/22.3 |
| 5,172,011 | 12/1992 | Leuthold et al. | 327/202 |
| 5,172,397 | 12/1992 | Llewellyn | 327/141 |
| 5,210,759 | 5/1993 | DeWitt et al. | 371/22.3 |
| 5,347,523 | 9/1994 | Khatri et al. | 371/22.3 |
| 5,390,190 | 2/1995 | Nanda et al. | 327/141 |
| 5,418,481 | 5/1995 | Sikkink et al. | 327/144 |
| 5,477,545 | 12/1995 | Haung | 371/22.3 |
| 5,537,062 | 7/1996 | Mote, Jr. | 327/141 |
| 5,574,731 | 11/1996 | Qureshi | 371/22.3 |
| 5,587,682 | 12/1996 | Ranganathan et al. | 327/200 |
| 5,594,367 | 1/1997 | Trimberger et al. | 326/41 |
| 5,606,565 | 2/1997 | Edler et al. | 371/22.3 |
| 5,619,157 | 4/1997 | Kumata et al. | 327/203 |
| 5,633,606 | 5/1997 | Gaudet et al. | 327/203 |
| 5,646,567 | 7/1997 | Felix | 327/202 |

FOREIGN PATENT DOCUMENTS

| | | | |
|---|---|---|---|
| 63-48014 | 2/1988 | Japan | 327/202 |
| 1-268220 | 10/1989 | Japan | 327/141 |
| 3-1608 | 1/1991 | Japan | 327/202 |
| 3-22610 | 1/1991 | Japan | 327/141 |
| 3-34617 | 2/1991 | Japan | 327/212 |
| 1325677 | 7/1987 | U.S.S.R. | 327/141 |

OTHER PUBLICATIONS

Fazal Ur Rehman Qureshi, "Declaration of Fazal Ur Rehman Qureshi" (regarding U.S. Patent Application No. 08/727,289), dated Sep. 23, 1997, pp. 1–3 and Exhibits A and B.
National Semiconductor, Amplifier Applications, "LMC6980/84/88 Fuel Gauge & Charge Control Solution", date unknown, pp. 1–66 thru 1–71, no date.
National Semiconductor, "Intelligent Batteries Provide Updated Status Information, Longer Battery Life", date unknown, pp. 1–3, internet address: http://www.national-.com/appinfo/lowpowervolt/brochure/8_9.html, no date.
Hill and Peterson, "Digital Logic and Microprocessors", John Wiley & Sons, 1984, pp. 491–493, no month.
Masakazu Shoji, "CMOS Digital Circuit Technology", Prentice Hall, 1988, pp. 299–307, no month.
Gibson and Liu, "Microcomputers for Engineers and Scientists", Prentice–Hall, Inc., 1987, pp. 103–109, no month.
Harold S. Stone, "Microcomputer Interfacing", Addison–Wesley, 1982, pp. 88–100, no month.

Primary Examiner—Timothy P. Callahan
Assistant Examiner—T. T. Lam
Attorney, Agent, or Firm—Limbach & Limbach L.L.P.

[57] ABSTRACT

A flip-flop cell having a main data input, a main scan data input, a main data output and a main clock input. The flip-flop cell includes a multiplexer having first and second inputs and an output. The first input is coupled to the main data input of the flip-flop cell and the second input is coupled to the main scan data input of the flip-flop cell. A first latch has a data input, a data output and an inverting clock input. The data input of the first latch is coupled to the output of the multiplexer. A second latch has a data input, a data output and a non-inverting clock input. The data input of the second latch is coupled to the data output of the first latch. A third latch has a data input, a data output and an inverting clock input. The data input of the third latch is coupled to the data output of the second latch, and the data output of the third latch is coupled to the main data output of the flip-flop cell. The inverting clock input of the first latch, the non-inverting clock input of the second latch, and the inverting clock input of the third latch are all coupled to the main clock input of the flip-flop cell.

17 Claims, 8 Drawing Sheets

5,774,003

FLIP-FLOP CELL HAVING CLOCK SKEW PROTECTION

BACKGROUND OF THE INVENTION

1. Field of the Invention

The present invention relates generally to digital flip-flops, and, in particular, to a flip-flop which is designed to provide immunity from clock skew.

2. Description of the Related Art

Clock skew can be a major problem in the design of digital circuits having multiple flip-flops and multiple clocks, for example, in an asynchronous environment. As the number of flip-flops and/or the number of clocks increases, so does the possibility of skew being a problem. Two or more clocks can have skew between them for many reasons, including for example, that the clocks are derived from two or more unique clocks or that the clocks are from a different distribution chain for the same clock. Whatever the reason, skew frequently causes a lack of correlation between actual and predicted silicon behavior.

The destructive effects of clock skew are best illustrated by an example. Referring to FIG. 1, the Q output of flip-flop A is connected to the D input of flip-flop B. Flip-flop A receives clock X, and flip-flop B receives clock Y. FIG. 2 illustrates the operation of flip-flops A and B under ideal conditions, i.e., when there is no skew between clocks X and Y. Because flip-flops A and B are rising edge-triggered D flip-flops, the output of flip-flop A goes high 28 in response to the rising edge 20 of clock X, and the output of flip-flop B goes high 30 in response to the rising edge 22 of clock Y. In the scenario illustrated in FIG. 2, flip-flop A's output data will be transferred to flip-flop B one clock period later. For example, when flip-flop A's output goes low 32 in response to rising edge 24, flip-flop B's output goes low 34 in response to rising edge 26 one clock period later. In other words, flip-flop B takes up flip-flop A's "previous" value, while flip-flop A takes up a "new state". This is because both flip-flops A and B are updated at the same time on the rising edge of their respective clocks.

FIG. 3 illustrates the operation of flip-flops A and B when there is skew 44 between clocks X and Y. In this scenario, flip-flop B takes up the "new" value of flip-flop A as opposed to taking up the "previous" value of flip-flop A. Specifically, flip-flop A's output goes high 36 in response to the rising edge 38 of clock X, and flip-flop B's output goes high 40 in response to the rising edge 42 of clock Y.

The skew 44 between clocks X and Y causes the rising edge 42 of clock Y to trigger flip-flop B after the output of flip-flop A has already gone high 36. Because flip-flop A's output is the input of flip-flop B, the output 40 of flip-flop B, in response to rising edge 42, is the "new" value 36 of flip-flop A. In other words, because of the skew 44 between clocks X and Y, the data races through flip-flop A.

Because the existence and/or amount of clock skew tends to be unpredictable, such skew makes the behavior of flip-flop circuits unpredictable. Although FIG. 1 shows the Q output of flip-flop A being connected to the D input of flip-flop B, it will be appreciated that skew has similar "destructive" effects on any other type of connection between flip-flops A and B. For example, if the Q or Q_ output of flip-flop A is connected to flip-flop B's scan data input, asynchronous set or asynchronous reset, skew between clocks X and Y will similarly make the output of flip-flop B unpredictable. Furthermore, the problems associated with clock skew are not unique to the specific types of D flip-flops shown in FIG. 1. Specifically, flip-flops A and B are so called "scan" flip-flops which include a second "scan data" input (SI), multiplexed with the D input, which allows the flip-flop to operate as a shift register. Skew can have negative effects on the operation of any type of flip-flop, whether or not it includes set and/or reset functions, is a scan flip-flop, or is a D flip-flop.

For example, a normal scan flip flop having the multiplexed D flip-flop arrangement is referred to herein as an "SFFD", a normal scan flip flop with an asynchronous set capability is referred to herein as an "SFFDS", a normal scan flip flop with an asynchronous reset capability is referred to herein as an "SFFDR", and a normal scan flip flop with an asynchronous set and reset is referred to herein as an "SFFDRS". Table I below summarizes many of the connections between flip-flops A and B in which clock skew can create a problem:

TABLE I

| Flip-Flop A's output | Flip-Flop B Type is | Connecting with flop B's input |
| --- | --- | --- |
| Data out | SFFD | Normal data |
|  |  | Scan data |
| Data out | SFFDS | Normal data |
|  |  | Scan data |
|  |  | Asynchronous Set |
| Data out | SFFDR | Normal data |
|  |  | Scan data |
|  |  | Asynchronous Reset |
| Data out | SFFDRS | Normal data |
|  |  | Scan data |
|  |  | Asynchronous Reset and Set |

Table I deals with connections only between scan flip-flops. Clock skew is also a problem for non-scan flip-flops having similar connections.

One specific example in which skew can have destructive effects on the operation of scan flip-flops is illustrated in FIG. 4. It is well known that the testing of an integrated circuit has become a significant part of its total cost. Thus, techniques which can simplify such testing can help to reduce manufacturing costs. FIG. 4 illustrates a portion of an integrated circuit 45 which has been designed to include features which simplify its own testing. Such circuits are often referred to as having a design for test feature, or DFT. Scan flip-flops have sometimes been used in such circuits to implement DFT.

Integrated circuit 45 includes logic circuits 46, 47. After the manufacturing process of integrated circuit 45 is complete, it may be desirable or necessary to test logic circuits 46, 47. If logic circuits 46, 47 were isolated circuit components, they could be easily tested by providing a set of inputs and verifying that the correct output data is generated. However, logic circuits 46, 47 are "buried" in the integrated circuit 45 such that direct access to their inputs and outputs is not possible, making testing of logic circuits 46, 47 difficult.

In order to provide a way to test logic circuits 46, 47, it is well known in the art to use conventional scan flip-flops 48, 49 to shift test values into the circuit 45, as well as shift the current contents of the flip-flops out of the circuit 45 in order to verify their values. For example, by using flips-flops 48, test values for the inputs of logic circuit 47 can be shifted into scan input A and the current output values of logic circuit 46 can be shifted out of scan output A. By using flip-flops 49, the current output values of logic circuit 47 can be shifted out of scan output B and test values for the inputs of the next logic circuit (not shown) can be shifted into scan input B. These shift operations are referred to as "scan shift" operations. Thus, by using the scan flip-flops 48, 49 (which have the shifting capability), rather than non-scan flip-flops, the integrated circuit 45 has been designed for testing, i.e., Scan-DFT.

The ideal environment for implementing Scan-DFT is the pure computing one, i.e., a single clock and synchronous in nature. However, for practical reasons Scan-DFT is sometimes implemented in a non-computing environment, i.e., multiple clocks and asynchronous in nature. This is the scenario illustrated in FIG. 4, and this is the environment in which clock skew becomes a problem.

Clocks A, B and C are independent clocks. If there is skew between any of them, the scan shift operation can be destroyed in the manner described above with respect to FIG. 3. In other words, certain of the flip-flops 48, 49 in the chain may take the "new" value of the immediately preceding flip-flop. This will create incorrect and meaningless data at the scan outputs A and B, thus defeating the purpose of DFT.

There have been some ad-hoc attempts to solve the skew problem, but they have generally been very silicon intensive and provided limited protection. Such attempts usually involve delaying signals to provide a certain amount of skew protection. The amount of skew protection tends to be somewhat proportional to the amount of delay, i.e., the more silicon that is used to provide delays, the more skew protection that is obtained. In an environment having a large number of clocks, the silicon cost, i.e., die area, can be very high. Thus, a trade-off must be made between skew protection and die area, and, as is common with such trade-offs, a degree of uncertainty usually remains as to whether the chosen amount of skew protection is enough.

Thus, there is a need for an apparatus and method which will solve the problems created by clock skew on flip-flop circuits.

SUMMARY OF THE INVENTION

The present invention provides a flip-flop cell having a main data input, a main data output and a main clock input. The flip-flop cell includes a first latch having a data input, a data output and an inverting clock input. The data input of the first latch is coupled to the main data input of the flip-flop cell. A second latch has a data input, a data output and a non-inverting clock input. The data input of the second latch is coupled to the data output of the first latch. A third latch has a data input, a data output and an inverting clock input. The data input of the third latch is coupled to the data output of the second latch, and the data output of the third latch is coupled to the main data output of the flip-flop cell. The inverting clock input of the first latch, the non-inverting clock input of the second latch, and the inverting clock input of the third latch are all coupled to the main clock input of the flip-flop cell.

The present invention also provides a flip-flop cell having a main data input, a main data output and a main clock input. The flip-flop cell includes a flip-flop having a data input, a data output and a clock input. The flip-flop data input forms the main data input for the flip-flop cell and the flip-flop clock input forms the main clock input for the flip-flop cell. The flip-flop is triggered in response to data on the flip-flop data input and a first rising edge of a clock received at the flip-flop clock input. A latch having a data input, a data output and an inverting clock input, has its data input coupled to the data output of the flip-flop. The inverting clock input of the latch is coupled to the clock input of the flip-flop, and the data output of the latch forms the main data output for the flip-flop cell. The latch is triggered in response to data on the flip-flop data output and a first falling edge of the clock immediately following the first rising edge received at the flip-flop clock input.

The present invention also provides a circuit having a design for test feature. The circuit includes a plurality of flip-flops each having a main data input, a main scan data input, a main data output and a main clock input. The flip-flops are arranged serially in a chain with the main data output of each flip-flop being coupled to the main scan data input of an adjacent flip-flop. Each of the flip-flops includes first, second and third latches coupled serially and successively together with the second latch being triggered in response to a first rising edge of a clock received at the flip-flop main clock input and the third latch being triggered in response to a first falling edge immediately following the first rising edge of the clock received at the flip-flop main clock input. A data input of the first latch is coupled to the main data input of the flip-flop and a data output of the third latch is coupled to the main data output of the flip-flop.

The present invention also provides a method of performing a flip-flop function. The method includes the steps of: receiving a data bit at a main data input; receiving a clock signal at a main clock input; latching the data bit with a first latch on a first falling edge of the clock signal; latching an output of the first latch with a second latch on a first rising edge of the clock signal immediately following the first falling edge; latching an output of the second latch with a third latch on a second falling edge of the clock signal immediately following the first rising edge; and transferring an output of the third latch to a main data output.

The present invention also provides a method of providing skew protection in a flip-flop having a data input, a data output and a clock input. The method includes the steps of: coupling the data output of the flip-flop to an input of a latch; coupling the clock input of the flip-flop to a clock input of a latch; generating a data bit at the data output of the flip-flop on a first rising edge of a clock signal received at the clock input of the flip-flop; latching the data bit with the latch on a first falling edge of the clock signal immediately following the first rising edge; and providing an output of the latch as an alternative to the output of the flip-flop.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 5:
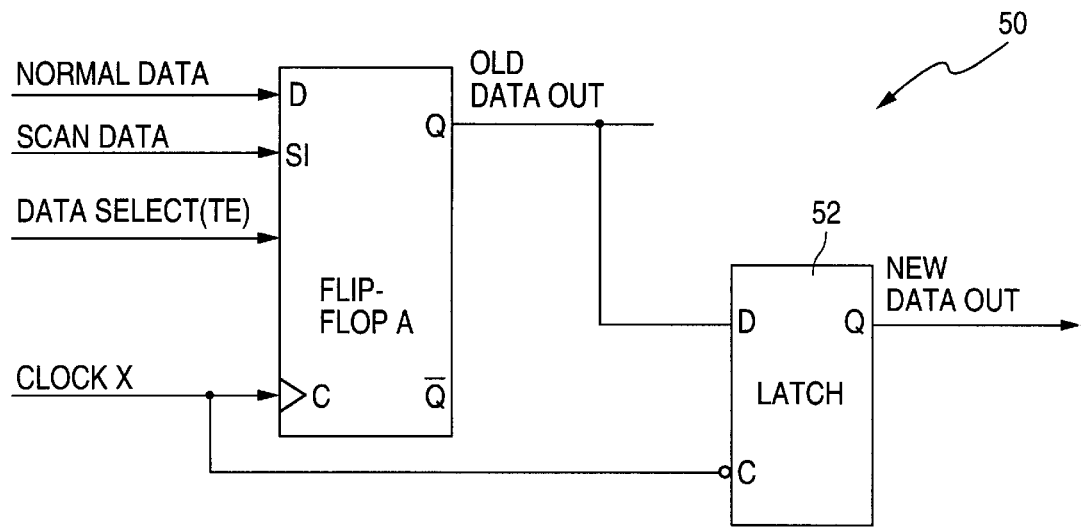
FIG. 5 is a schematic diagram illustrating a flip-flop in accordance with the present invention.

Referring to FIG. 5, there is illustrated a flip-flop cell 50 in accordance with the present invention. The cell 50 has been designed to provide immunity from skew in a very cost effective and uniform/methodical manner. The cell 50 may or may not include the scan data input, set and/or reset functions, and may be used as a replacement cell, i.e., replacing conventional flip-flops, to provide the same function as the replaced flip-flop, as well as skew immunity. One-half of a clock period worth of skew immunity is provided. One advantage of this is that, assuming a user has the option to run a system at different frequencies, the one-half period of skew immunity can be as large or small as the user chooses.

The flip-flop cell 50 includes a conventional flip-flop, such as flip-flop A, and a latch 52. The latch 52 is connected to the same clock that is used to drive flip-flop A, in this case clock X, and to a data output of flip-flop A. The output of the latch 52 is the new data output for flip-flop A. The latch 52 is triggered on the falling edge of clock X.

Figure 1:
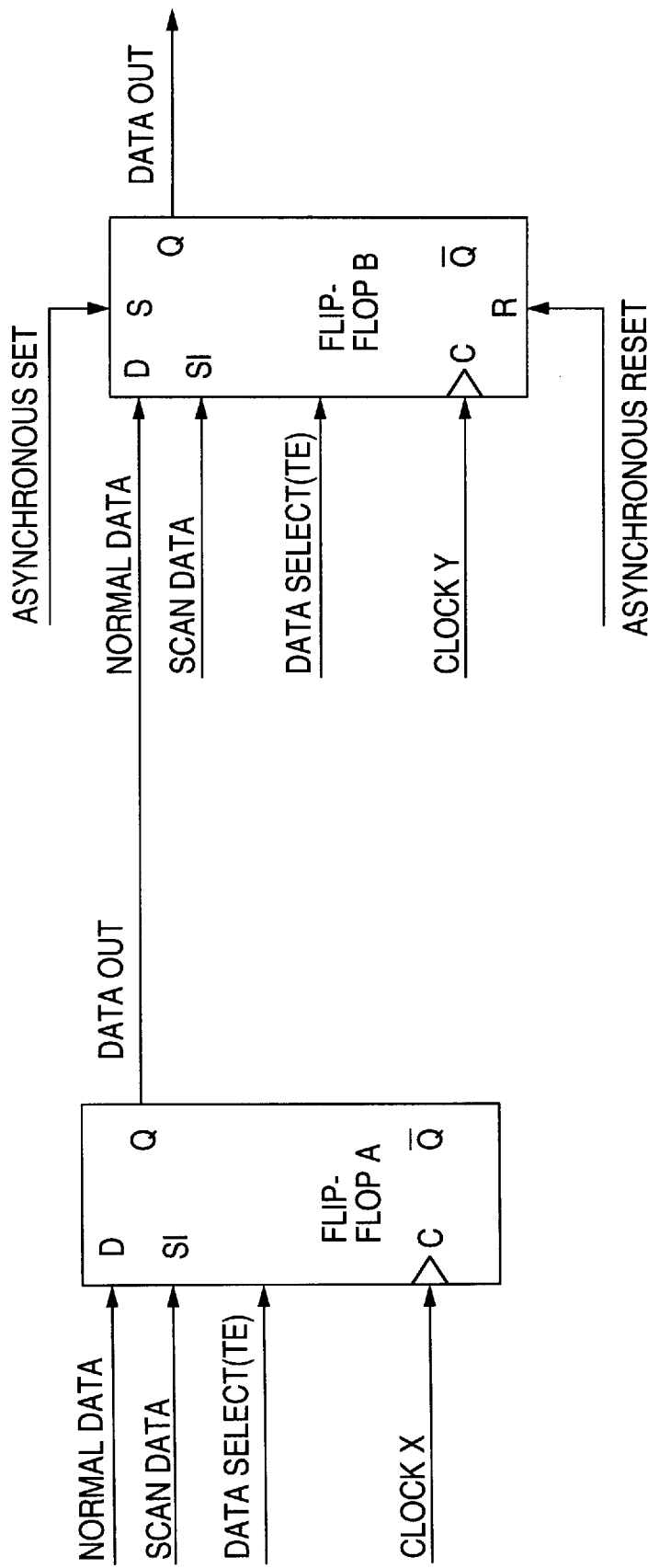
FIG. 1 is a schematic diagram illustrating two conventional flip-flops.
Figure 2:
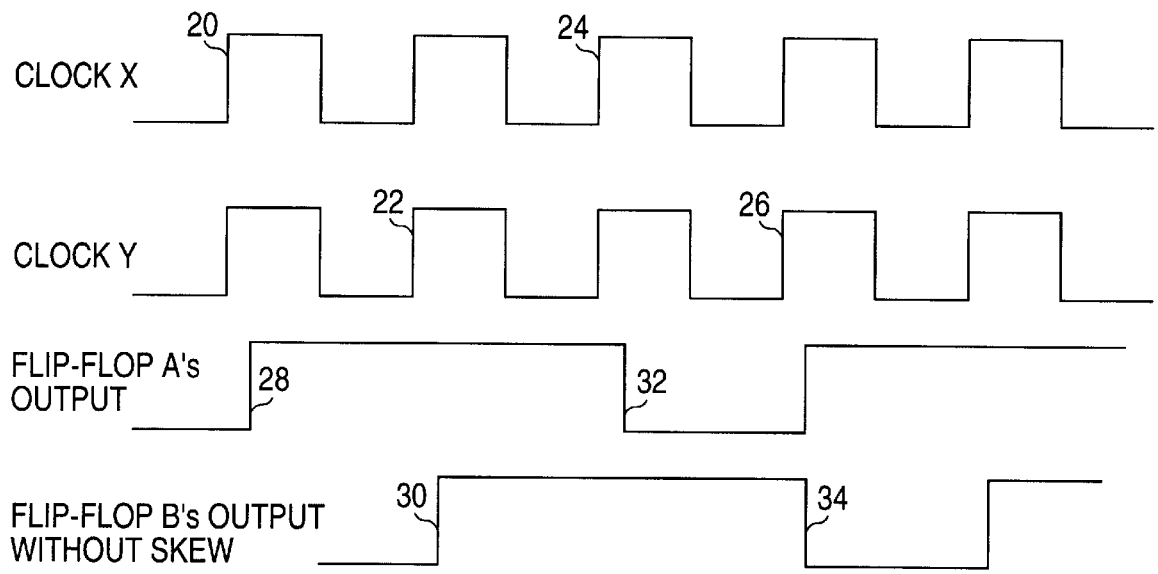
FIG. 2 is a timing diagram illustrating the operation of the flip-flops shown in FIG. 1 when there is no clock skew.
Figure 3:
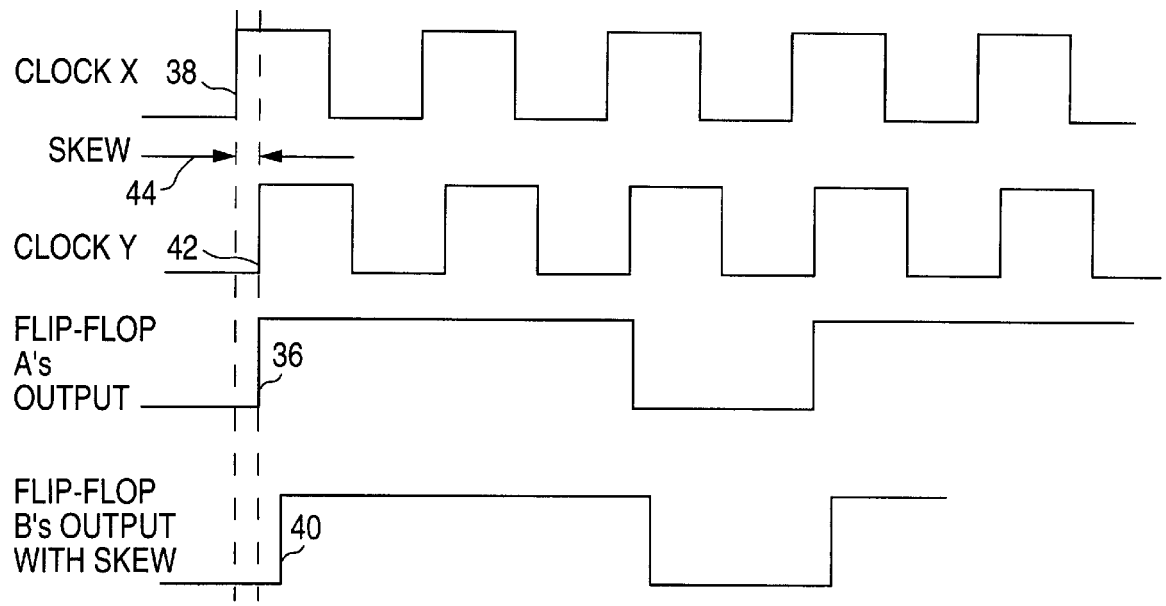
FIG. 3 is a timing diagram illustrating the operation of the flip-flops shown in FIG. 1 when there is clock skew.
Figure 6:
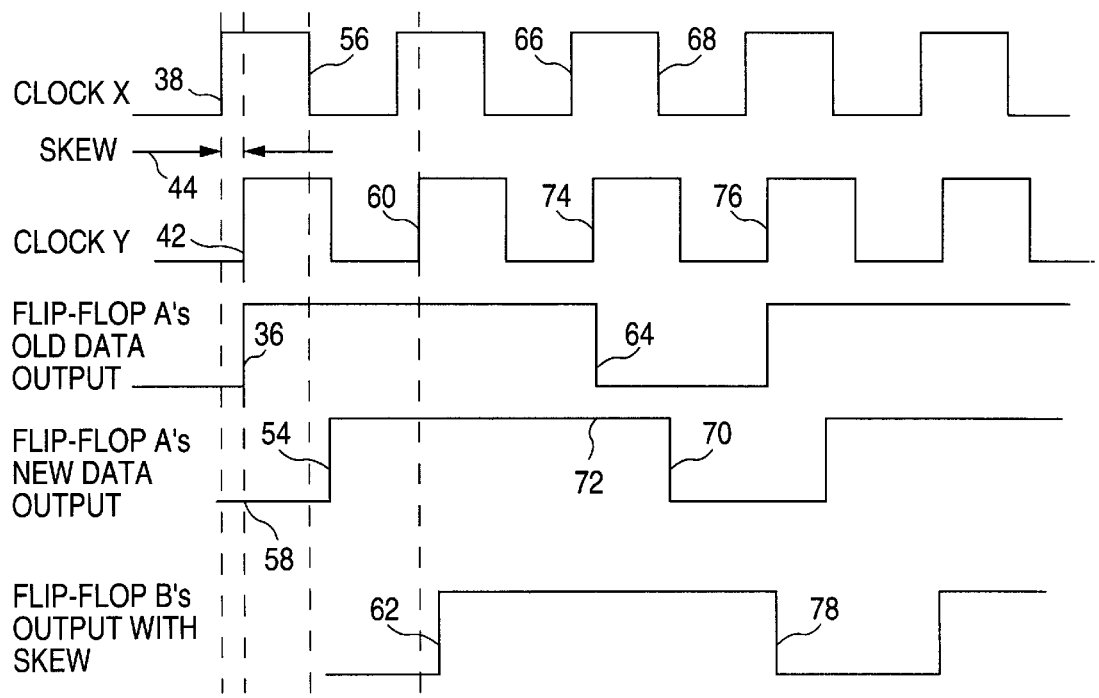
FIG. 6 is a timing diagram illustrating the operation of the flip-flop shown in FIG. 5.
Figure 10:
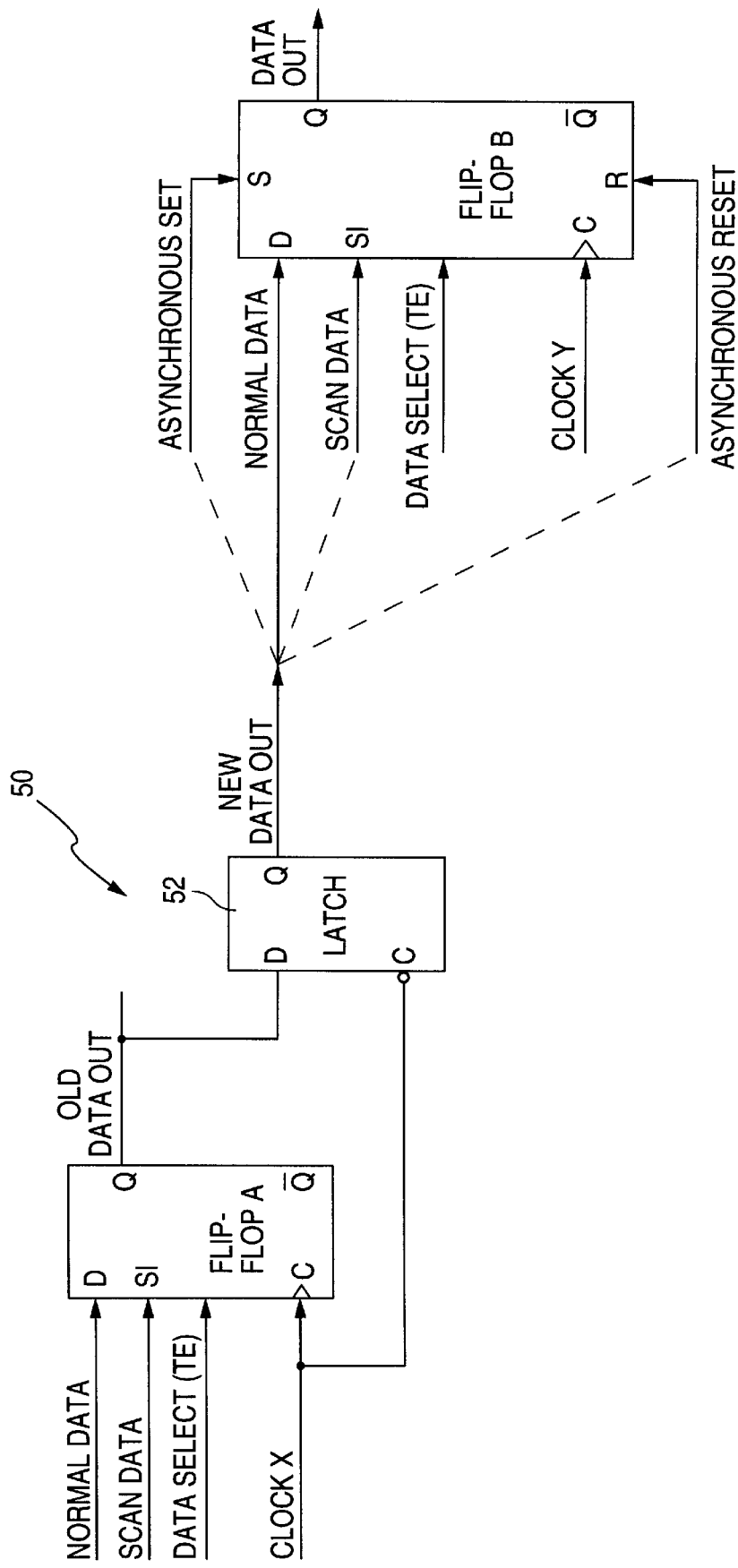
FIG. 10 is a schematic diagram illustrating the flip-flop cell of FIG. 5 replacing flip-flop A of FIG. 1, in accordance with the present invention.

FIG. 6 illustrates the operation of the flip-flop cell 50 when it is used to replace flip-flop A in FIG. 1, as is shown in FIG. 10. Again, clocks X and Y have a certain amount of skew 44 between them. Flip-flop A's old data output goes high 36 in response to the rising edge 38 of clock X. Flip-flop A's new data output, i.e., the output of the latch 52, does not go high 54 until the falling edge 56 of clock X. This means that the input of flip-flop B, i.e., the new data output of flip-flop A, is still low 58 on the rising edge 42 of clock Y. This prevents flip-flop B's output from going high in response to the rising edge 42 of clock Y. Instead, flip-flop B's output goes high 62 in response to the rising edge 60 of clock Y. Thus, flip-flop A's output data (from the old data output) is correctly and predictably transferred to flip-flop B one clock period later.

Flip-flop A's old data output goes low 64 in response to the rising edge 66 of clock X. This is followed by flip-flop A's new data output, i.e., the output of the latch 52, going low 70 on the next falling edge 68 of clock X. Because the input of flip-flop B, i.e., the new data output of flip-flop A, is still high 72 on the rising edge 74 of clock Y, the output of flip-flop B remains high after the rising edge 74. Thus, flip-flop B takes up flip-flop A's "previous" value, while flip-flop A takes up a "new state". Finally, one clock period later, on the rising edge 76 of clock Y, the output of flip-flop B goes low 78 because its input, i.e., flip-flop A's new data output, is low.

The flip-flop cell 50 provides normal/expected behavior despite the skew 44 between clocks X and Y. Because flip-flop A's new data output does not go high 54 until the falling edge 56 of clock X, the amount of skew immunity that is provided is equal to one-half of a clock period (or clock cycle), i.e., the period of time between the rising edge 38 of clock X and the falling edge 56 of clock X.

Figure 7:
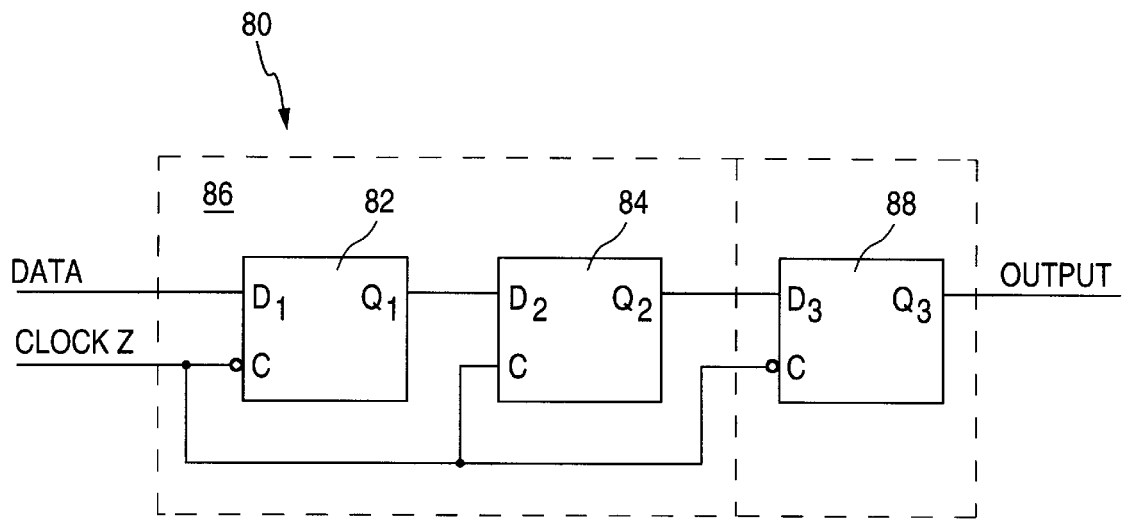
FIG. 7 is a detailed schematic diagram illustrating another flip-flop in accordance with the present invention.

Referring to FIG. 7, there is illustrated a detailed schematic of a flip-flop cell 80 in accordance with the present invention. The flip-flop cell 80 is basically the same as the flip-flop cell 50 except that the "scan data" feature has been omitted. Again, it should be well understood that the teachings of the present invention apply to any type of flip-flop, including but not limited to, D flip-flops, scan flip-flops, flip-flops having set and/or reset functions, etc. In accordance with the present invention, a latch is added to the output of these flip-flops in order to provide one-half period of skew immunity.

The two latches 82, 84 form a conventional D flip-flop 86. The first latch 82 is triggered on the falling edge of clock Z, and the second latch 84 is triggered on the rising edge of clock Z. In accordance with the present invention, a third latch 88 is included. The third latch 88 is triggered on the falling edge of clock Z.

Figure 8:
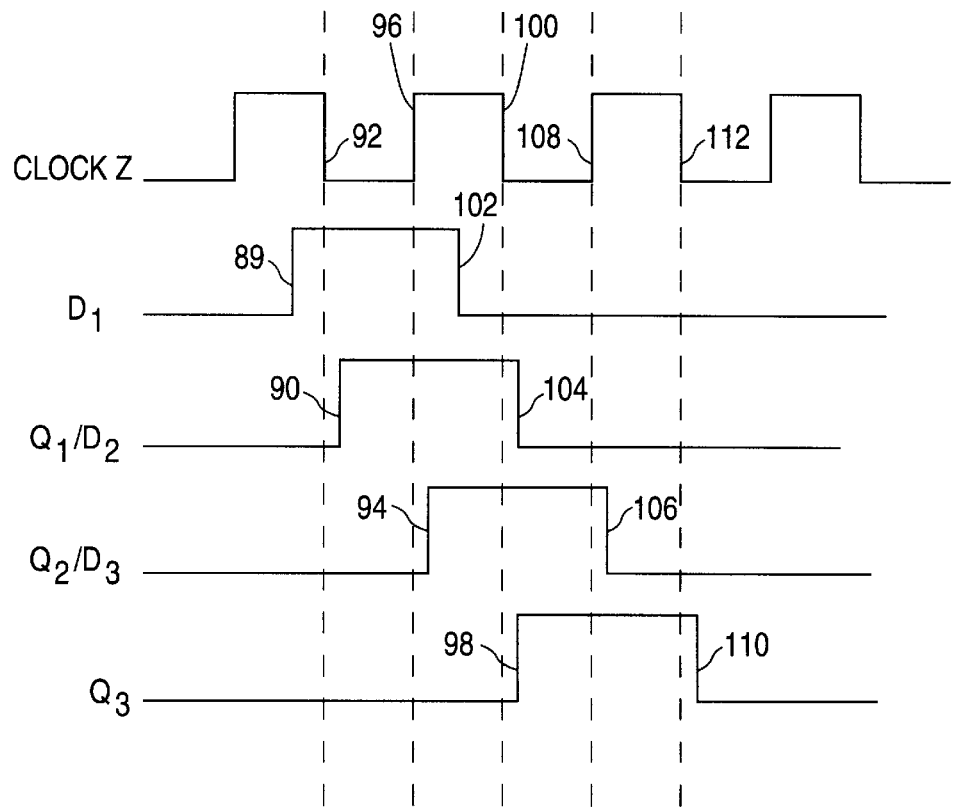
FIG. 8 is a timing diagram illustrating the operation of the flip-flop shown in FIG. 7.

FIG. 8 illustrates the operation of the flip-flop cell 80. Initially, input $D_1$ goes high 89. Output $Q_1$ goes high 90 in response to the falling edge 92 of clock Z. Consequently, output $Q_2$ goes high 94 in response to the rising edge 96 of clock Z, and output $Q_3$ goes high 98 in response to the falling edge 100 of clock Z. When input $D_1$ is brought low 102, output $Q_1$ goes low 104 on the next falling edge 100 of clock Z. Consequently, output $Q_2$ goes low 106 in response to the rising edge 108 of clock Z, and output $Q_3$ goes low 110 in response to the falling edge 112 of clock Z.

Figure 9:
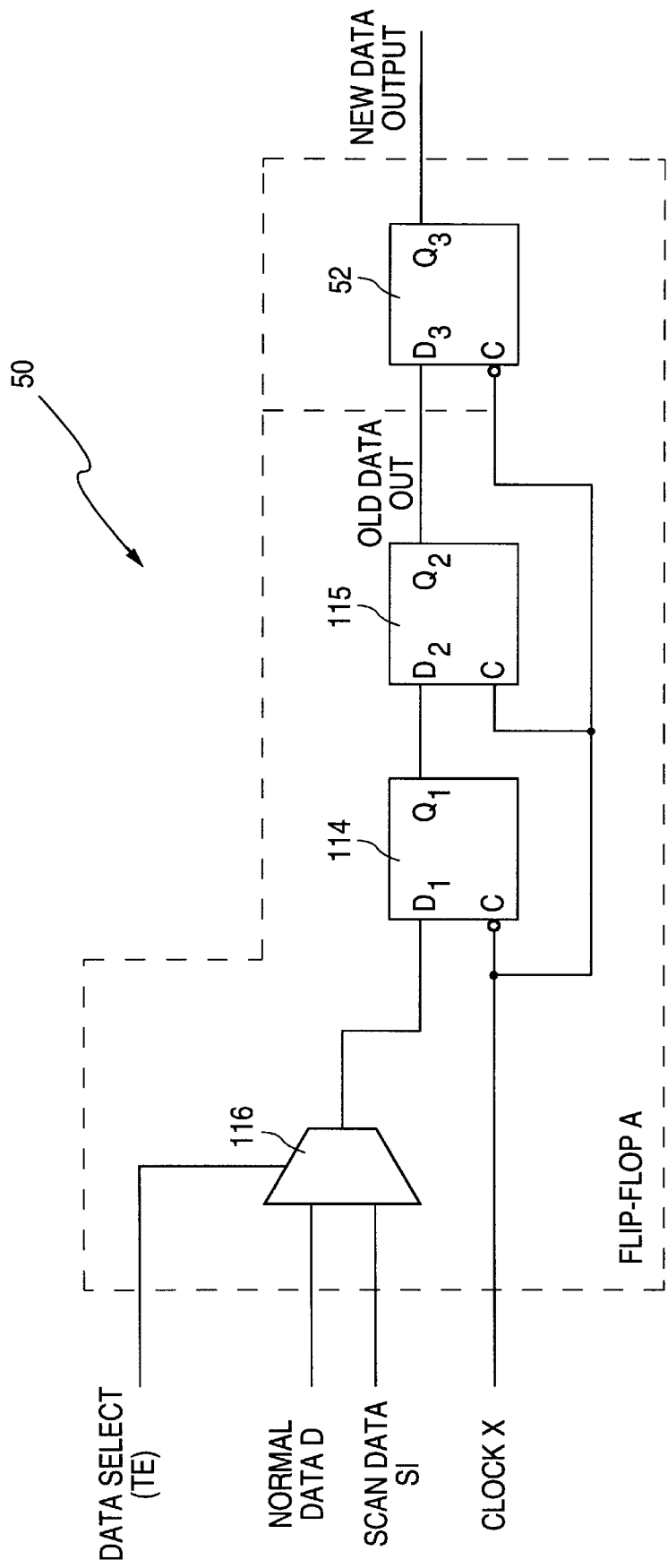
FIG. 9 is a detailed schematic diagram illustrating the flip-flop shown in FIG. 5.

Referring to FIG. 9, there is illustrated a detailed schematic diagram of the flip-flop cell 50. Specifically, a multiplexer 116 having two inputs has its output coupled to the latch 114. One of the inputs of the multiplexer 116 serves as the D input and the other input serves as the scan data input SI. A control input TE is used to select either the D input or the SI input of the multiplexer 116 to route data to the data input of latch 114.

Figure 4:
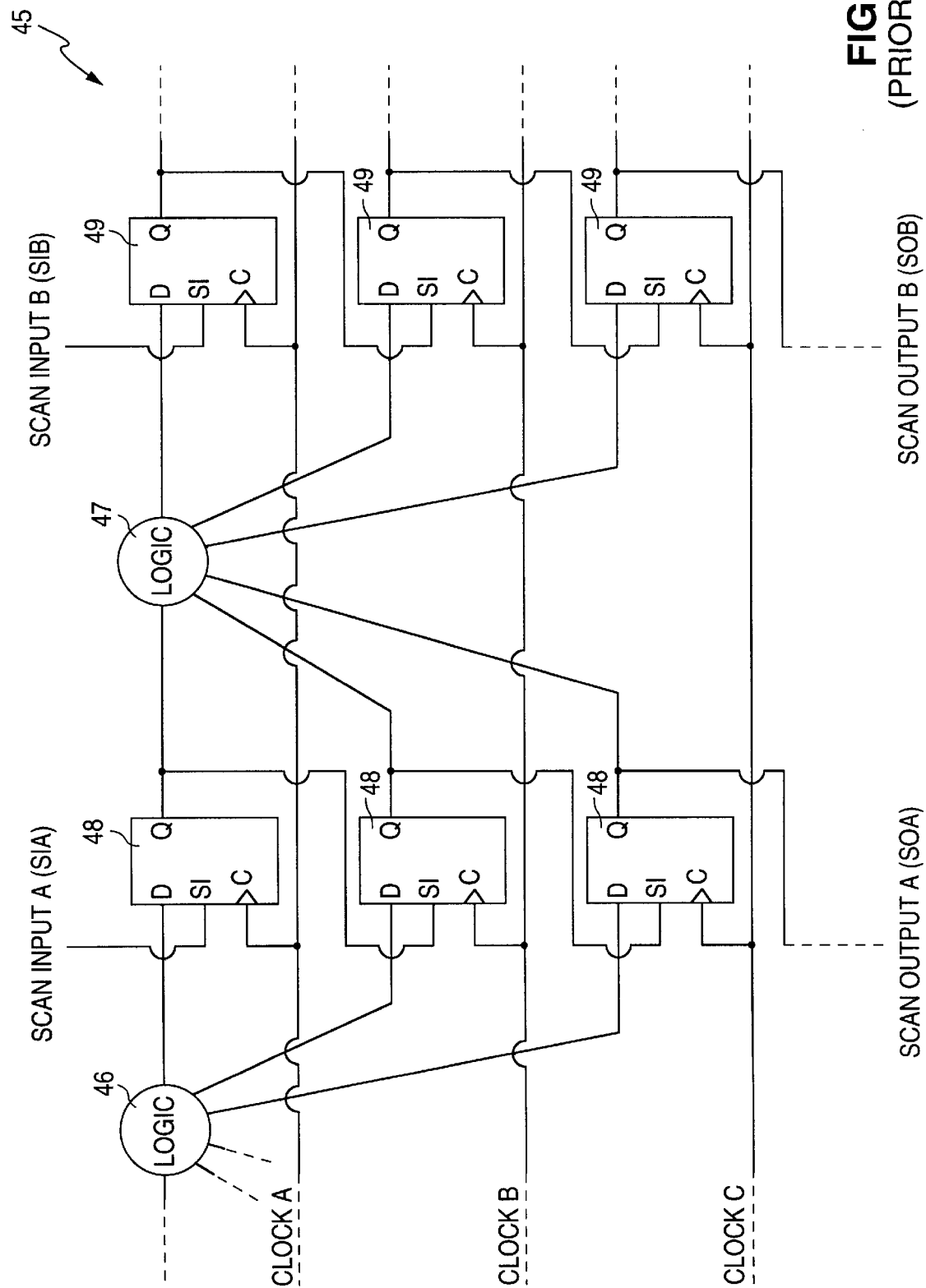
FIG. 4 is a schematic diagram illustrating a conventional design for test (DFT) circuit.
Figure 11:
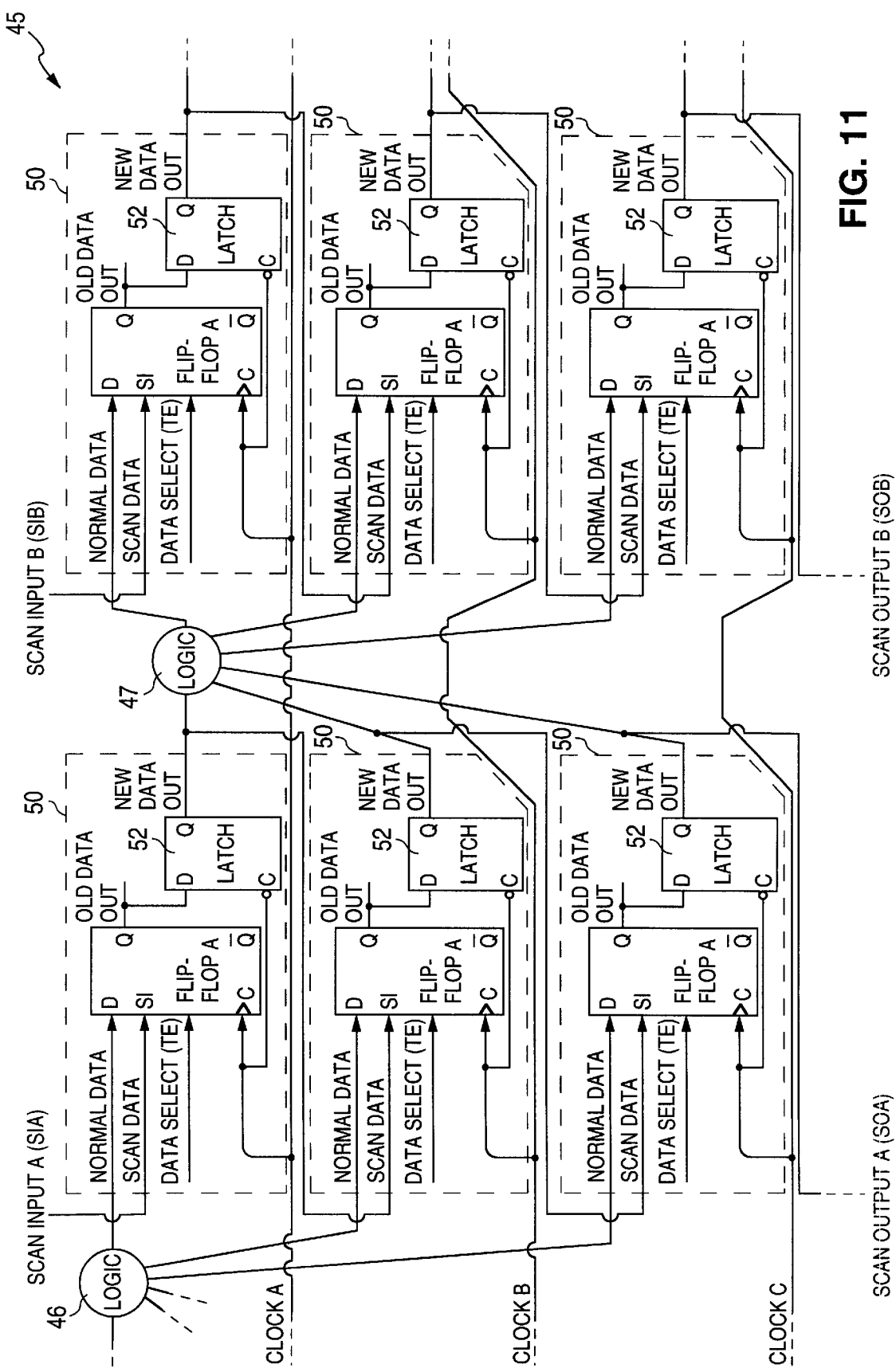
FIG. 11 is a schematic diagram illustrating the flip-flop cell of FIG. 5 replacing all of the scan flip-flops of FIG. 4, in accordance with the present invention.

One particularly advantageous application for the flip-flop cell 50 of the present invention is in the DFT circuit 45 (FIG. 4). Specifically, the flip-flop cell 50 could be used to replace all, or some, of the scan flip-flops 48, 49 in the integrated circuit 45, as is shown in FIG. 11. This would prevent any adverse effect on the scan shift operation caused by the skew between clocks A, B and C.

In general, whenever a connection between conventional flip-flops is likely to encounter a skew problem, the conventional flip-flops can be replaced by one of the flip-flop cells 50, 80. Again, a flip-flop circuit in accordance with the present invention may be a scan or non-scan flip-flop, and may or may not include set and/or reset functions, etc. The flip-flop circuits 50, 80 will provide the same function as the original replaced flip-flop, and in addition, will provide one-half cycle of skew immunity.

The inclusion of the latches 52, 88 in the flip-flop cells 50, 80, respectively, requires less silicon die area than the ad-hoc attempts to solve the skew problem discussed above. For example, Table II below summarizes the estimated increases in cell area, over conventional scan flip-flops having no skew protection, of scan flip-flops having about 4 ns of skew protection using one of the ad-hoc solutions discussed above and several variations of the scan flip-flop 50 of the present invention. As can be seen from Table II, there is a dramatic reduction in the area overhead for the cells of the present invention.

TABLE II

| Flip-Flop A's type | Area increase for 4ns delay using ad-hoc solution | Area increase for new cell 50 of present invention |
| --- | --- | --- |
| SFFD | An increase of 88% | An increase of 36% |
| SFFDS | An increase of 73% | An increase of 30% |
| SFFDR | An increase of 80% | An increase of 33% |
| SFFDRS | An increase of 60% | An increase of 24% |

Thus, the flip-flop cells 50, 80 of the present invention provide a less expensive and more reliable solution to the clock skew problem.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A circuit having a design for test feature, comprising:

logic circuitry;

a plurality of flip-flop cells each having a main data input, a main scan data input, a main data output and a main clock input, the flip-flop cells being arranged serially in a chain with the main data input of each flip-flop cell being coupled to the logic circuitry, the main data output of each flip-flop cell being coupled to the main scan data input of an adjacent flip-flop cell, and the main clock input of each flip-flop cell being coupled to a different one of a plurality of independent clock signals that each have an amount of skew between them;

each of the flip-flop cells including first, second and third latches coupled serially and successively together with the second latch being triggered in response to a first rising edge of one of the plurality of independent clock signals received at the flip-flop cell main clock input and the third latch being triggered in response to a first falling edge immediately following the first rising edge of the one of the plurality of independent clock signals received at the flip-flop cell main clock input, a data input of the first latch being coupled to the main data input of the flip-flop cell and a data output of the third latch being coupled to the main data output of the flip-flop cell.

2. A circuit in accordance with claim 1, wherein each of the flip-flop cells further comprises:

a multiplexer having first and second inputs and an output, the output being coupled to the data input of the first latch, the first input being coupled to the main data input of the flip-flop cell and the second input being coupled to the main scan data input of the flip-flop cell.

3. A circuit in accordance with claim 2, wherein each of the flip-flop cells further comprises:

a control input configured to select one of the first and second inputs of the multiplexer to route data to the data input of the first latch.

4. A method of performing a flip-flop function, comprising the steps of:

providing a data bit to a main data input of a first flip-flop cell having first, second and third latches;

providing a first clock signal to a main clock input of the first flip-flop cell;

latching the data bit with the first latch on a first falling edge of the first clock signal;

latching an output of the first latch with the second latch on a first rising edge of the first clock signal immediately following the first falling edge;

latching an output of the second latch with the third latch on a second falling edge of the first clock signal immediately following the first rising edge;

transferring an output of the third latch to a main data output of the first flip-flop cell;

transferring an output of the main data output of the first flip-flop cell to an input of a second flip-flop cell;

providing a second clock signal to a clock input of the second flip-flop cell, the first and second clock signals having an amount of skew between them; and transferring the input of the second flip-flop cell to an output of the second flip-flop cell on a first rising edge of the second clock signal which follows the first rising edge of the first clock signal by a sum of one clock period and the amount of skew present between the first and second clock signals.

5. A method in accordance with claim 4, further comprising the steps of:

receiving a data bit at a main scan data input of the first flip-flop cell; and multiplexing the main data input of the first flip-flop cell with the main scan data input.

6. A method in accordance with claim 5, further comprising the step of:

selecting between the main data input and the main scan data input of the first flip-flop cell.

7. A method of providing skew protection during a transfer of data from a first flip-flop to a second flip-flop, each flip-flop having a data input, a data output and a clock input, the method comprising the steps of:

providing a first clock signal to the clock input of the first flip-flop;

providing a data bit to the data input of the first flip-flop;

coupling the data output of the first flip-flop to an input of a latch;

coupling the clock input of the first flip-flop to a clock input of a latch;

generating a data bit at the data output of the first flip-flop on a first rising edge of the first clock signal received at the clock input of the first flip-flop;

latching the data bit with the latch on a first falling edge of the first clock signal immediately following the first rising edge of the first clock signal;

providing an output of the latch to the data input of the second flip-flop;

providing a second clock signal to the clock input of the second flip-flop, the first and second clock signals having an amount of skew between them; and transferring data on the data input of the second flip-flop to the data output of the second flip-flop on a first rising edge of the second clock signal which follows the first rising edge of the first clock signal by a sum of one clock period and the amount of skew present between the first and second clock signals.

8. A method in accordance with claim 7, wherein the first and second flip-flops each comprise a scan flip-flop having a scan data input.

9. A method of compensating for clock skew when performing a shift operation between a first flip-flop and a second flip-flop, the method comprising:

providing a first clock signal to a clock input of the first flip-flop;

providing a second clock signal to a clock input of the second flip-flop, the first and second clock signals having an amount of skew between them;

providing a data bit to a data input of the first flip-flop;

transferring the data bit through the first flip-flop to an output of the first flip-flop on a first rising edge of the first clock signal;

providing the data bit present at the output of the first flip-flop to an input of a latch;

providing the first clock signal to a clock input of the latch;

transferring the data bit through the latch to an output of the latch in response to a first falling edge of the first clock signal following the first rising edge of the first clock signal by one-half clock period;

providing the data bit present at the output of the latch to a data input of the second flip-flop; and transferring the data bit through the second flip-flop to an output of the second flip-flop on a first rising edge of the second clock signal which follows the first rising edge of the first clock signal by a sum of one clock period and the amount of skew present between the first and second clock signals;

wherein the data bit is prevented from being transferred through the second flip-flop on a rising edge of the second clock signal which occurs earlier than the first rising edge of the second clock signal.

10. A method in accordance with claim 9, wherein the step of providing the data bit present at the output of the latch to a data input of the second flip-flop comprises the step of:

providing the data bit present at the output of the latch to a normal data D input of the second flip-flop.

11. A method in accordance with claim 9, wherein the step of providing the data bit present at the output of the latch to a data input of the second flip-flop comprises the step of:

providing the data bit present at the output of the latch to a scan data input of the second flip-flop.

12. A method of compensating for clock skew when performing a shift operation between a first flip-flop and a second flip-flop, the method comprising:

replacing the first flip-flop with a flip-flop cell comprising a third flip-flop and a latch, a data output of the third flip-flop being connected to a data input of the latch and a clock input of the third flip-flop being connected to a clock input of the latch;

providing a first clock signal to the clock input of the third flip-flop;

providing a second clock signal to a clock input of the second flip-flop, the first and second clock signals having an amount of skew between them;

providing a data bit to a data input of the third flip-flop;

transferring the data bit through the third flip-flop to the data output of the third flip-flop on a first rising edge of the first clock signal;

transferring the data bit present at the data output of the third flip-flop through the data input of the latch to an output of the latch in response to a first falling edge of the first clock signal following the first rising edge of the first clock signal by one-half clock period;

providing the data bit present at the output of the latch to a data input of the second flip-flop; and transferring the data bit through the second flip-flop to an output of the second flip-flop on a first rising edge of the second clock signal which follows the first rising edge of the first clock signal by a sum of one clock period and the amount of skew present between the first and second clock signals;

wherein the data bit is prevented from being transferred through the second flip-flop on a rising edge of the second clock signal which occurs earlier than the first rising edge of the second clock signal.

13. A method in accordance with claim 12, wherein the step of providing the data bit present at the output of the latch to a data input of the second flip-flop comprises the step of:

providing the data bit present at the output of the latch to a normal data D input of the second flip-flop.

14. A method in accordance with claim 12, wherein the step of providing the data bit present at the output of the latch to a data input of the second flip-flop comprises the step of:

providing the data bit present at the output of the latch to a scan data input of the second flip-flop.

15. A method of compensating for clock skew when using a first flip-flop to asynchronously set a second flip-flop, the method comprising:

providing a first clock signal to a clock input of the first flip-flop;

providing a second clock signal to a clock input of the second flip-flop, the first and second clock signals having an amount of skew between them;

providing a data bit to a data input of the first flip-flop;

transferring the data bit through the first flip-flop to an output of the first flip-flop on a first rising edge of the first clock signal;

providing the data bit present at the output of the first flip-flop to an input of a latch;

providing the first clock signal to a clock input of the latch;

transferring the data bit through the latch to an output of the latch in response to a first falling edge of the first clock signal following the first rising edge of the first clock signal by one-half clock period;

providing the data bit present at the output of the latch to an asynchronous set input of the second flip-flop; and asynchronously setting the second flip-flop in response to the data bit being provided to the asynchronous set input of the second flip-flop during a clock period of the second clock signal which starts with a first rising edge of the second clock signal which follows the first rising edge of the first clock signal by the amount of skew between the first and second clock signals;

wherein the second flip-flop is prevented from being set during a clock period of the second clock signal which occurs earlier than the first rising edge of the second clock signal.

16. A method of compensating for clock skew when using a first flip-flop to asynchronously reset a second flip-flop, the method comprising:

providing a first clock signal to a clock input of the first flip-flop;

providing a second clock signal to a clock input of the second flip-flop, the first and second clock signals having an amount of skew between them;

providing a data bit to a data input of the first flip-flop;

transferring the data bit through the first flip-flop to an output of the first flip-flop on a first rising edge of the first clock signal;

providing the data bit present at the output of the first flip-flop to an input of a latch;

providing the first clock signal to a clock input of the latch;

transferring the data bit through the latch to an output of the latch in response to a first falling edge of the first clock signal following the first rising edge of the first clock signal by one-half clock period;

providing the data bit present at the output of the latch to an asynchronous reset input of the second flip-flop; and asynchronously resetting the second flip-flop in response to the data bit being provided to the asynchronous reset input of the second flip-flop during a clock period of the second clock signal which starts with a first rising edge of the second clock signal which follows the first rising edge of the first clock signal by the amount of skew between the first and second clock signals;

wherein the second flip-flop is prevented from being reset during a clock period of the second clock signal which occurs earlier than the first rising edge of the second clock signal.

17. A method of testing a logic circuit with a scan shift operation which compensates for clock skew, comprising the steps of:

arranging a plurality of flip-flops serially in a first chain with a normal data input of each flip-flop being coupled to the logic circuit;

arranging a plurality of latches serially in a second chain with a data input of each latch being coupled to a data output of an associated flip-flop, a clock input of each latch being coupled to a clock input of its associated flip-flop, and a data output of each latch being coupled to a scan data input of an adjacent flip-flop;

providing a different one of a plurality of independent clock signals to the clock input of each flip-flop, the independent clock signals having an amount of skew between them;

transferring a data bit present at the scan data input of a first flip-flop in the first chain to the data output of the first flip-flop on a first rising edge of a first of the plurality of independent clock signals;

transferring the data bit present at the data output of the first flip-flop through its associated latch to an output of the associated latch on a first falling edge of the first clock signal immediately following the first rising edge of the first clock signal; and transferring the data bit present at the output of the associated latch through the scan data input of a second flip-flop in the first chain to an output of the second flip-flop on a first rising edge of a second of the plurality of independent clock signals which follows the first rising edge of the first clock signal by a sum of one clock period and the amount of skew present between the first and second clock signals;

wherein the data bit is prevented from being transferred through the second flip-flop on a rising edge of the second clock signal which occurs earlier than the first rising edge of the second clock signal.

* * * * *

UNITED STATES PATENT AND TRADEMARK OFFICE
CERTIFICATE OF CORRECTION

PATENT NO.: 5,774,003
DATED: June 30, 1998
INVENTOR(S): Fazal Ur Rehman Qureshi et al.

It is certified that an error appears in the above-identified patent and that said Letters Patent is hereby corrected as shown below:

On the cover page, at [75] Inventors: delete "Fazal Ur Rahman Qureshi" and replace with --Fazal Ur Rehman Qureshi--.

Signed and Sealed this

Twenty-fifth Day of August, 1998

Attest:

BRUCE LEHMAN

*Attesting Officer*   *Commissioner of Patents and Trademarks*